US011437925B2

(12) United States Patent
Chiang et al.

(10) Patent No.: US 11,437,925 B2
(45) Date of Patent: Sep. 6, 2022

(54) GREEN BRIDGE CIRCUIT FOR ADJUSTING DIRECT CURRENT POWER SOURCE AND ALTERNATING CURRENT POWER SOURCE

(71) Applicant: Sercomm Corporation, Taipei (TW)

(72) Inventors: Meng-Chien Chiang, Taipei (TW); Kuo-Fu Weng, Taipei (TW)

(73) Assignee: Sercomm Corporation, Taipei (TW)

( * ) Notice: Subject to any disclaimer, the term of this patent is extended or adjusted under 35 U.S.C. 154(b) by 53 days.

(21) Appl. No.: 17/117,136

(22) Filed: Dec. 10, 2020

(65) Prior Publication Data

US 2021/0305911 A1 Sep. 30, 2021

(30) Foreign Application Priority Data

Mar. 26, 2020 (CN) .......................... 202010223196.6

(51) Int. Cl.
*H02M 7/219* (2006.01)
*H02M 1/00* (2006.01)
(Continued)

(52) U.S. Cl.
CPC ...... *H02M 7/219* (2013.01); *G01R 19/16538* (2013.01); *G05F 3/18* (2013.01); *H03K 5/24* (2013.01); *H02M 1/0025* (2021.05)

(58) Field of Classification Search
CPC .. H02M 3/1582; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17;
(Continued)

(56) References Cited

U.S. PATENT DOCUMENTS 4,283,683 A * 8/1981 Main ..................... H03F 3/3081
330/262
5,682,022 A * 10/1997 Schroder-Brumloop ....................
H02H 7/16
187/290
(Continued)

FOREIGN PATENT DOCUMENTS

| CN | 1767341 | 5/2006 |
| CN | 102904421 | 1/2015 |
| CN | 108922886 | 11/2018 |

OTHER PUBLICATIONS

"Office Action of China Counterpart Application", dated Mar. 18, 2022, p. 1-p. 9.

*Primary Examiner* — Thienvu V Tran
*Assistant Examiner* — Nusrat Quddus
(74) *Attorney, Agent, or Firm* — JCIPRNET (57) ABSTRACT

A green bridge circuit for adjusting a DC power source and an AC power source is provided. The green bridge circuit includes a bridge circuit and a bias adjustment circuit. The bridge circuit includes four transistors connected to a first power terminal, a system load, and a second power terminal. The bias adjustment circuit has an input terminal coupled to an output terminal of the bridge circuit and an output terminal coupled to control terminals of the transistors. The bias adjustment circuit changes bias voltages of the control terminals of the transistors according to a rectified voltage outputted by the bridge circuit. In this way, loss is reduced, heat generation is prevented, and transmission loss is addressed.

6 Claims, 5 Drawing Sheets

(51) Int. Cl.
*H03K 5/24* (2006.01)
*G05F 3/18* (2006.01)
*G01R 19/165* (2006.01)

(58) Field of Classification Search
CPC ........... H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/12; H02M 3/3155; H02M 3/33507; H02M 3/33546; H02M 7/1557; H02M 7/1626; H02M 1/4208; H02M 7/12; H02M 7/151; H02M 1/4233; H02M 5/4585; H02M 7/219; H02M 1/08; H02M 7/1552; H02M 7/1623; H02M 1/4225; H02M 3/33592; H02M 3/073; H02M 3/10; H02M 3/135; H02M 3/137; H02M 7/00; H02M 7/064; H02J 3/46; H02J 3/38; H02J 7/12; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; G05F 1/30; G05F 1/33; G05F 1/32; G05F 1/34; G05F 1/38; G05F 1/52; H02H 7/122; H02H 7/1222; H02H 7/1225; H02H 7/1227; H02H 7/125; H02H 7/1252; H02H 7/1255; H02H 7/1257

See application file for complete search history.

(56) References Cited

U.S. PATENT DOCUMENTS

| | | | |
|---|---|---|---|
| 6,501,320 B1 | 12/2002 | Le | |
| 9,712,159 B2* | 7/2017 | Isoda | H03K 19/0185 |
| 2009/0268497 A1* | 10/2009 | Liu | H02M 7/219 |
| | | | 363/127 |
| 2011/0002150 A1* | 1/2011 | Yoo | H02M 7/219 |
| | | | 363/127 |
| 2011/0141782 A1* | 6/2011 | Sells | H02M 7/219 |
| | | | 363/127 |
| 2013/0049839 A1* | 2/2013 | Cheng | H03D 1/2272 |
| | | | 327/306 |
| 2014/0098582 A1* | 4/2014 | Oki | H02M 7/217 |
| | | | 363/80 |
| 2014/0104909 A1* | 4/2014 | Kwong | H02M 7/219 |
| | | | 363/127 |
| 2016/0172961 A1* | 6/2016 | Deng | H02M 3/158 |
| | | | 327/109 |

* cited by examiner

FIG. 6

GREEN BRIDGE CIRCUIT FOR ADJUSTING DIRECT CURRENT POWER SOURCE AND ALTERNATING CURRENT POWER SOURCE

CROSS-REFERENCE TO RELATED APPLICATION

This application claims the priority benefit of China application no. 202010223196.6, filed on Mar. 26, 2020. The entirety of the above-mentioned patent application is hereby incorporated by reference herein and made a part of this specification.

BACKGROUND

Technical Field

The disclosure relates to a power supply control technology, and in particular, to a green bridge circuit for adjusting a direct current (DC) power source and an alternating current (AC) power source.

Description of Related Art

A diode bridge is a common rectifier for the DC or AC power source and may be formed by a plurality of diodes. Nevertheless, in certain applications, the use of diodes may lead to heat generation due to excessive loss, even causing failure of passing the test standard sometimes. On the other hand, when the transmission line is excessively long, the voltage outputted by the DC power source may be reduced, even causing abnormal operation of the back-end system as a result.

SUMMARY

The disclosure provides a green bridge circuit in which transistors are used instead of diodes, and in this way, loss is lowered, heat generated is reduced, and an outputted voltage may be appropriately adjusted.

In an embodiment of the disclosure, a green bridge circuit includes, but not limited to, a bridge circuit and a bias adjustment circuit. The bridge circuit is configured to connected to a system load through a filter and includes a first transistor, a second transistor, a third transistor, and a fourth transistor. The first transistor has a first terminal connected to a first power terminal and a second terminal connected to the filter. The second transistor has a first terminal connected to a second power terminal and a second terminal connected to the filter. The third transistor has a first terminal connected to the second power terminal and a second terminal connected to the filter. The first terminal of the third transistor is further coupled to the first terminal of the second transistor, and the second terminal of the third transistor is further coupled to the second terminal of the first transistor. The fourth transistor has a first terminal connected to the first power terminal and a second terminal connected to the filter. The first terminal of the fourth transistor is further coupled to the first terminal of the first transistor, and the second terminal of the fourth transistor is further coupled to the second terminal of the second transistor. The bias adjustment circuit has a first input terminal coupled to an output terminal of the bridge circuit, a first output terminal coupled to a control terminal of the first transistor, and a second output terminal coupled to a control terminal of the second transistor. The bias adjustment circuit changes a bias voltage of the control terminal of the third transistor and a bias voltage of the control terminal of the second transistor according to a rectified voltage outputted by the bridge circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
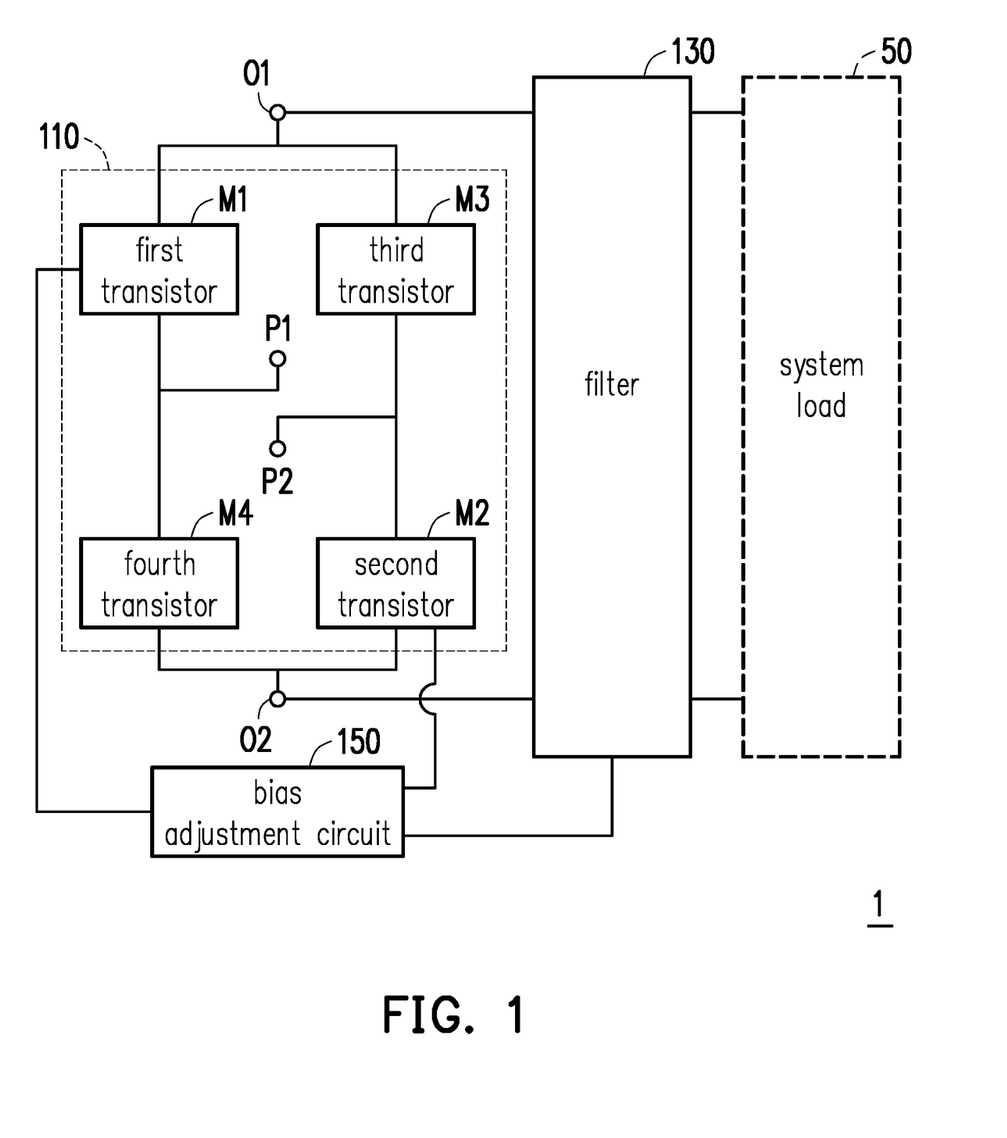
FIG. 1 is a block diagram of components of a green bridge circuit according to an embodiment of the disclosure.

FIG. 1 is a block diagram of components of a green bridge circuit 1 according to an embodiment of the disclosure. The green bridge circuit 1 is used to power a system load 50 and includes, but not limited to, a bridge circuit 110, a filter 130, and a bias adjustment circuit 150. These circuits may be applied to, for example, devices such as IP cameras, passive optical network (GPON)/Ethernet passive optical network (EPON) home gateways, wireless access points, WiFi routers, broadband access equipment, etc.

Figure 2:
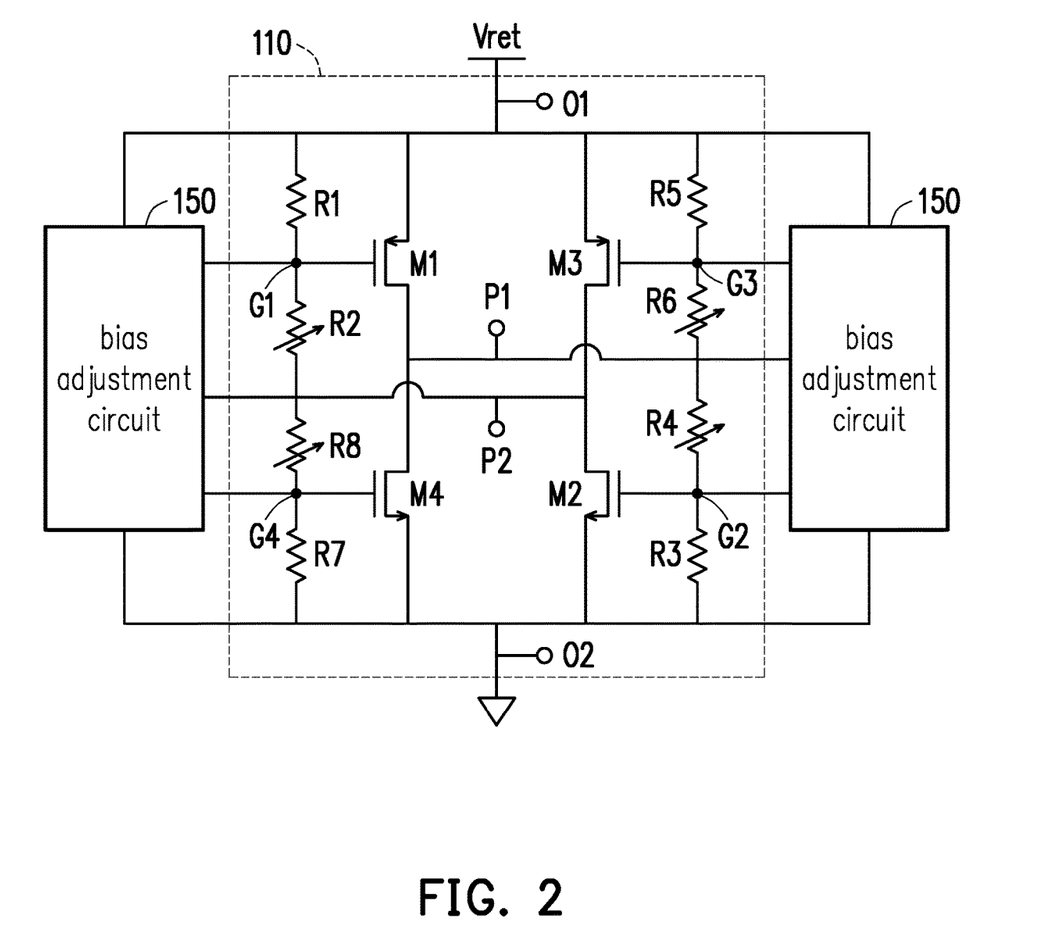
FIG. 2 is a schematic circuit diagram of a bridge circuit and a bias adjustment circuit according to an embodiment of the disclosure.

FIG. 2 is a schematic circuit diagram of the bridge circuit 110 and the bias adjustment circuit 150 according to an embodiment of the disclosure. The bridge circuit 110 includes a first transistor M1, a second transistor M2, a third transistor M3, and a fourth transistor M4.

The first transistor M1 has a first terminal (e.g., drain) connected to a first power terminal P1 and a second terminal (e.g., source) connected to an output terminal O1.

The second transistor M2 has a first terminal (e.g., drain) connected to a second power terminal P2 and a second terminal (e.g., source) connected to an output terminal O2. Note that the bridge circuit 110 may receive a DC power source or an AC power source through the first power terminal P1 and the second power terminal P2.

The third transistor M3 has a first terminal (e.g., drain) connected to the second power terminal P2 and a second terminal (e.g., source) connected to the output terminal O1. The first terminal of the third transistor M3 is further coupled to the first terminal of the second transistor M2, and the second terminal of the third transistor M3 is further coupled to the second terminal of the first transistor M1.

The fourth transistor M4 has a first terminal (e.g., drain) connected to the first power terminal P1 and a second terminal (e.g., source) connected to the output terminal O2. The first terminal of the fourth transistor M4 is further coupled to the first terminal of the first transistor M1, and the second terminal of the fourth transistor M4 is further coupled to the second terminal of the second transistor M2.

In the present embodiment, the first transistor M1 and the third transistor M3 are p-type metal oxide semiconductor field effect transistors (PMOS), and the second transistor M2 and the fourth transistor M4 are n-type metal oxide semiconductor field effect transistors (NMOS). In other embodiments, the first transistor M1, the second transistor M2, the third transistor M3, and the fourth transistor M4 may also be bipolar junction transistors (BJT) or other types of field effect transistors (FET).

In operation, when a voltage of the first power terminal P1 is greater than that of the second power terminal P2, the transistors M3 and M4 are cut off. At this time, if a bias voltage difference between a gate and the source of the transistor M1/transistor M2 is greater than a threshold voltage, the transistor M1/transistor M2 is turned on (assuming that the output terminals O1 and O2 are turned on).

Similarly, when a voltage of the second power terminal P2 is greater than that of the first power terminal P1, the transistor M1 and the transistor M2 are cut off. At this time, if a bias voltage difference between a gate and the source of the transistor M3/transistor M4 is greater than the threshold voltage, the transistor M3/transistor M4 is turned on (assuming that the output terminals O1 and O2 are turned on).

In an embodiment, the bridge circuit 110 further includes resistors R1 and R2, resistors R3 and R4, resistors R5 and R6, and resistors R7 and R8 respectively coupled to control terminals G1 to G4 (e.g., gates) of the first transistor M1, the second transistor M2, the third transistor M3, and the fourth transistor M4. Herein, the other terminals of the resistors R1 and R5 are connected to the output terminal O1, and the other terminals of the resistors R3 and R7 are grounded. The resistor R2 is coupled to the resistor R8, and the resistor R4 is coupled to the resistor R6. In addition, the bias adjustment circuit 150 is coupled to the control terminals G1 to G4 of the transistors M1 to M4 as well. Herein, the bias adjustment circuit 150 is further coupled to the first and second power terminals P1 and P2. Accordingly, the resistors R1 to R8 and the bias adjustment circuit 150 may respectively provide bias voltages to the control terminals G1 to G4 of the transistors M1 to M4 through voltage division.

Figure 3:
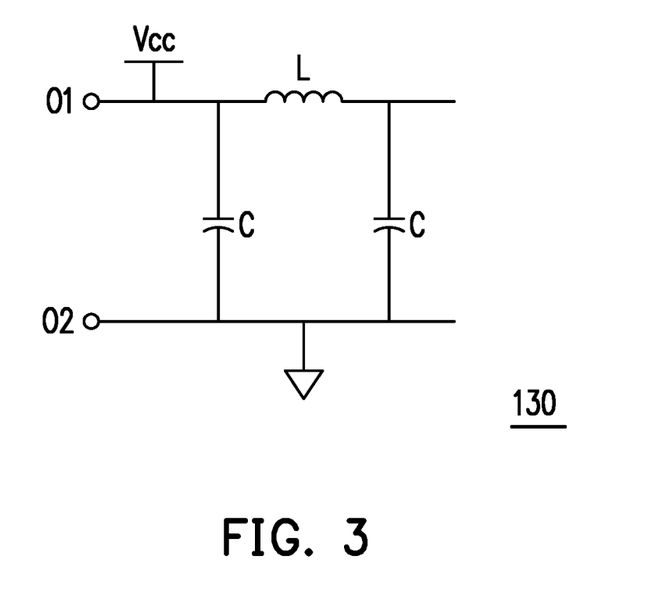
FIG. 3 is a schematic circuit diagram of a filter according to an embodiment of the disclosure.

FIG. 3 is a schematic circuit diagram of the filter 130 according to an embodiment of the disclosure. The filter 130 may be coupled to the output terminals O1 and O2 of the bridge circuit 110 and is configured to filter output of the bridge circuit 110. The filter 130 includes two capacitors C coupled between the output terminal O1 of the bridge circuit 110 and the ground, includes an inductor L coupled between terminals of the two capacitors C (or between the output terminal O1 of the bridge circuit 110 and the bias adjustment circuit 150), and receives an operating voltage Vcc. In other embodiments, the filter 130 may be coupled to other types of circuits, such as a RC circuit, a RLC circuit, and the like.

With reference to FIG. 1 and FIG. 2, the bias adjustment circuit 150 has an input terminal directly or indirectly coupled to the output terminal O1 of the bridge circuit 110, a first output terminal coupled to the control terminal G1 of the first transistor M1, and a second output terminal coupled to the control terminal G2 of the second transistor M2. In this embodiment, the bias adjustment circuit 150 may change a bias voltage of the control terminal G1 and a bias voltage of the control terminal G2 according to the rectified voltage outputted by the bridge circuit 110 (e.g., a voltage of the output terminal O1 or a voltage outputted through the filter 130). The first power terminal P1 and the second power terminal P2 provided by the embodiments of the disclosure may receive power input with multiple voltages or polarity properties, such as a 24-volt AC power source or a 12-volt DC power source. Nevertheless, an actually-inputted voltage may be reduced owing to transmission line loss, so that a voltage inputted to the system load 50 is further affected (insufficient required working voltage may lead to a failure of activation or occurrence of abnormality). In the embodiments of the disclosure, the bias voltages of the control terminals G1 and G2 are changed, the rectified voltage outputted by the bridge circuit 110 is accordingly changed, and that the system load 50 is provided with sufficient voltage to function normally. Resistors in FIG. 2 could be any value according to different input conditions.

In an embodiment, if the rectified voltage outputted by the bridge circuit 110 is less than a reference voltage, the bias adjustment circuit 150 may change the bias voltage of the control terminal G1 of the first transistor M1 and the bias voltage of the control terminal G2 of the second transistor M2. The reference voltage may be related to the voltage at which the system load 50 may function normally.

Figure 4:
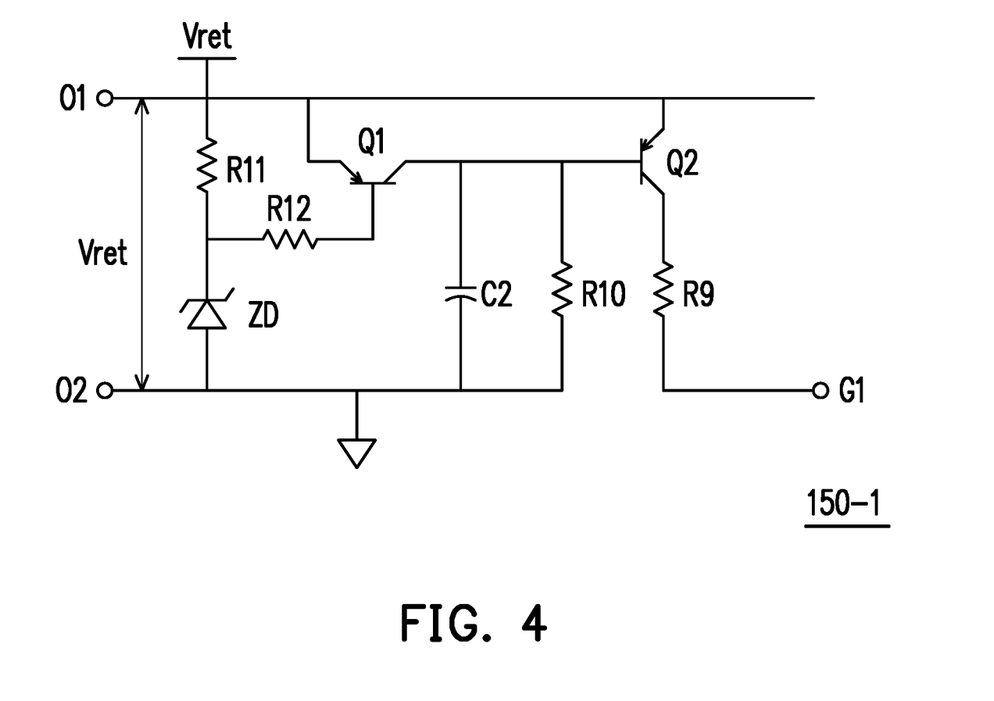
FIG. 4 is a schematic circuit diagram of a bias adjustment circuit according to a first embodiment of the disclosure.

FIG. 4 is a schematic circuit diagram of a bias adjustment circuit 150-1 according to a first embodiment of the disclosure. With reference to FIG. 2 and FIG. 4, the bias adjustment circuit 150-1 may be directly or indirectly coupled to the output terminals O1 and O2 of the bridge circuit 110. The bias adjustment circuit 150-1 includes switches Q1 and Q2 (the BJT in the figure is treated as an example, but may also be other types of switches such as a transistor, diode, and the like), resistors R9 to R12, a Zener diode ZD, and a capacitor C2. Emitters of the switches Q1 and Q2 are directly or indirectly coupled to the output terminal O1 of the bridge circuit 110, and a collector of the switch Q1 is coupled to a base of the switch Q2. If a rectified voltage Vret outputted by the bridge circuit 110 is less than a reference voltage of the Zener diode ZD, the switch Q1 is cut off, and the switch Q2 is turned on. In contrast, if the rectified voltage Vret is no less than the reference voltage, the switch Q1 is turned on, and the switch Q2 is cut off. For instance, it is assumed that the reference voltage is 30 volts. If an input power source is a 12-volt DC power source and the rectified voltage Vret is 12 volts, the switch Q1 is cut off but the switch Q2 is turned on. If the input power source is a 24-volt AC power source and the rectified voltage Vret is 32 volts, the switch Q2 is cut off but the switch Q1 is turned on.

The resistor R9 is coupled between the control terminal G1 and the switch Q2. When the switch Q2 is cut off, the bias voltage of the control terminal G1 is affected by impedance of the resistor R1 only. When the switch Q2 is turned on, the bias voltage of the control terminal G1 is affected by impedance (which is lower than the impedance of the resistor R1) of the resistor R1 and the resistor R9 after being connected in parallel. As such, impedance between the first terminal and the second terminal of the first transistor M1 is lowered, and that the voltage (or the rectified voltage Vret) of the output terminal O1 of the bridge circuit 110 is increased.

Further, the Zener diode ZD is coupled between the resistor R11 and the output terminal O2 of the bridge circuit 110. If the rectified voltage Vret is less than a second reference voltage (i.e., a breakdown voltage, and a value thereof may be identical to or different from that of the foregoing reference voltage), the Zener diode ZD breaks down. Moreover, if the rectified voltage Vret (passing through the resistor R11) is not less than the second reference voltage, the Zener diode ZD is cut off.

Note that the schematic diagram of FIG. 4 is provided to facilitate explanation of the disclosure. In practice, in order to allow the bias voltages of the control terminals G1 and G2 to be adjusted together, two groups (the switch Q2 and the resistor R9) may be disposed between the control terminal G1 and the second power terminal P2 and between the control terminal G2 and the first power terminal P1.

Figure 5:
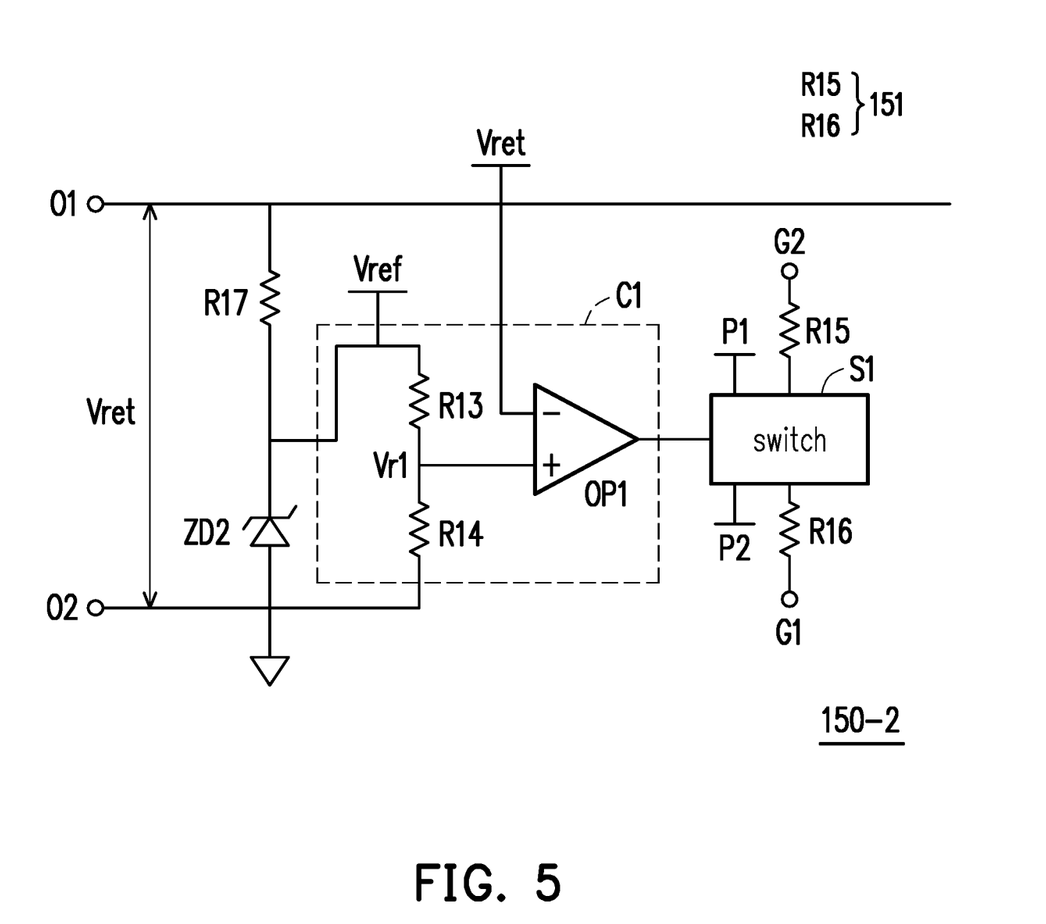
FIG. 5 is a schematic circuit diagram of a bias adjustment circuit according to a second embodiment of the disclosure.

FIG. 5 is a schematic circuit diagram of a bias adjustment circuit 150-2 according to a second embodiment of the disclosure. With reference to FIG. 2 and FIG. 5, the bias adjustment circuit 150-2 may be directly or indirectly coupled to the output terminals O1 and O2 of the bridge circuit 110. The bias adjustment circuit 150-2 includes a comparator C1, a switch S1, an impedance adjustment circuit 151, a resistor R17, and a Zener diode ZD2.

Different from the bias adjustment circuit 150-1, the bias adjustment circuit 150-2 compares the rectified voltage Vret with a reference voltage Vr1 (generated after a reference voltage Vref is divided by resistors R13 and R14) through the comparator C1. The comparator C1 includes an amplifier OP1 and the resistors R13 and R14. A non-inverting input terminal (represented by "+" in the figure) of the amplifier OP1 is coupled to the resistors R13 and R14. An input voltage of the resistor R13 is the reference voltage Vref, and the resistor R14 is grounded. An input voltage of an inverting input terminal (represented by "−" in the figure) of the amplifier OP1 is the rectified voltage Vret. If the rectified voltage Vret is less than the reference voltage Vr1, the amplifier OP1 outputs an enable signal, otherwise the amplifier OP1 outputs a disenable signal.

The switch S1 is coupled to an output terminal of the comparator C1, the first power terminal P1, the second power terminal P2, and resistors R15 and R16 of the impedance adjustment circuit 151. The switch S1 is turned on according to the enable signal outputted by the comparator C1 and is cut off according to the disenable signal.

The impedance adjustment circuit 151 is coupled to the switch S1 and decreases impedance between the control terminal G1 and the second power terminal P2 and impedance between the control terminal G2 and the first power terminal P1 according to a turning-on state of the switch S1.

In this embodiment, the impedance adjustment circuit 151 includes the resistor R15 coupled between the control terminal G2 and the switch S1 and the resistor 16 coupled between the control terminal G1 and the switch S1. When the switch S1 is cut off, the bias voltage of the control terminal G1/G2 is affected by the impedance of the resistor R1/R3 only. When the switch S1 is turned on, the bias voltage of the control terminal G1 is affected by impedance (i.e., reduced impedance) generated after the resistor R16 and the resistor R1 are connected in parallel, and the bias voltage of the control terminal G2 is affected by impedance generated after the resistor R15 and the resistor R3 are connected in parallel. As such, the impedance between the first terminal and the second terminal of the first transistor M1/second transistor M2 is lowered, and that the voltage (or the rectified voltage Vret) of the output terminal O1 of the bridge circuit 110 is increased. Operation of the Zener diode ZD2 is identical to that of the Zener diode ZD, and description thereof is thus not provided therein.

Figure 6:
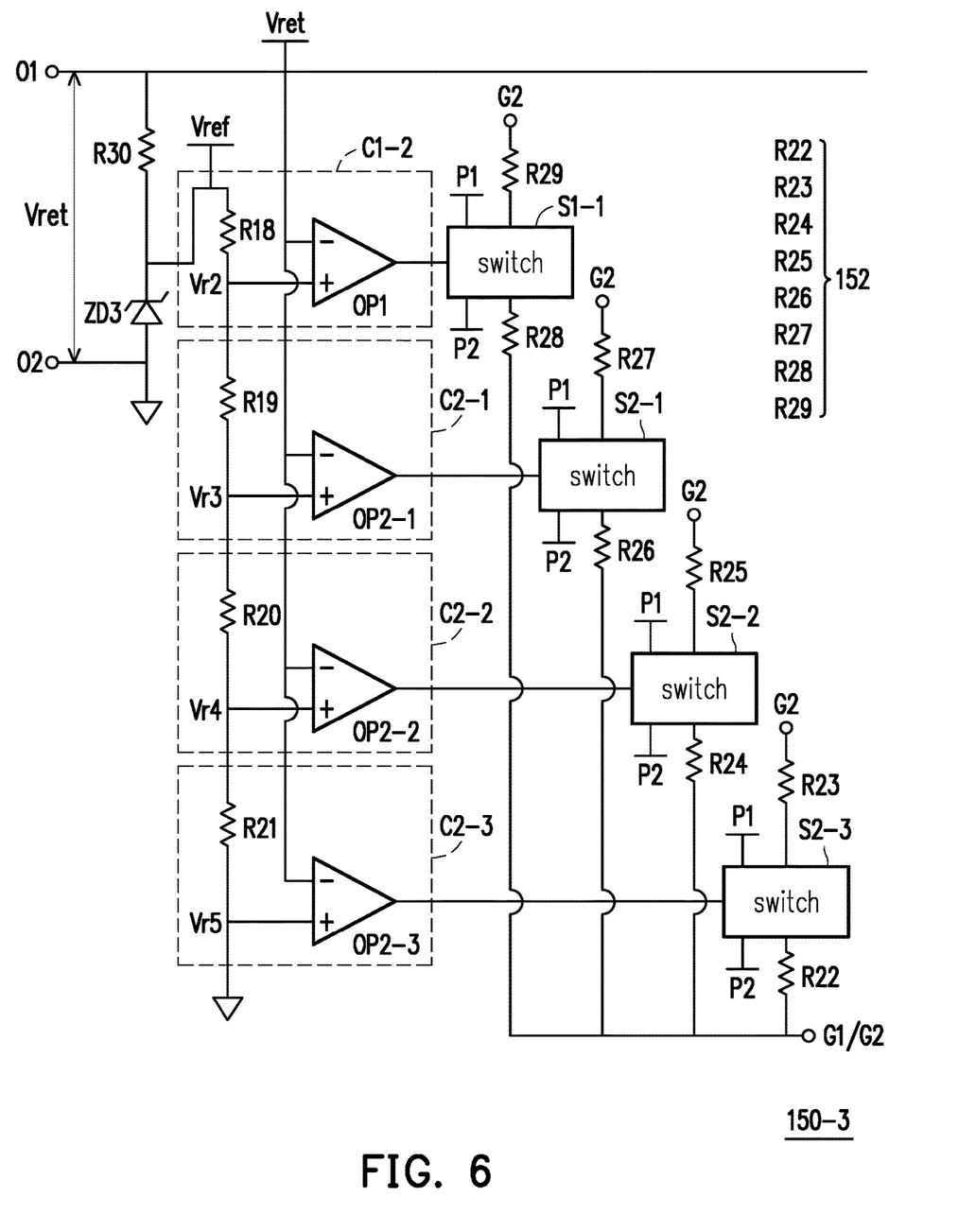
FIG. 6 is a schematic circuit diagram of a bias adjustment circuit according to a third embodiment of the disclosure.

FIG. 6 is a schematic circuit diagram of a bias adjustment circuit 150-3 according to a third embodiment of the disclosure. With reference to FIG. 2 and FIG. 6, the bias adjustment circuit 150-3 may be directly or indirectly coupled to the output terminals O1 and O2 of the bridge circuit 110. The bias adjustment circuit 150-3 includes comparators C1-2, C2-1, C2-2, and C2-3, switches S1-1, S2-1, S2-2, and S2-3, an impedance adjustment circuit 152, a resistor R30, and a Zener diode ZD3. Different from the bias adjustment circuit 150-2 provided in the second embodiment, the bias adjustment circuit 150-3 provides increased reference voltages so as to provide more stages of voltage optimization.

The comparator C1-2 includes an amplifier OP1 and a resistor R18. A non-inverting input terminal of the amplifier OP1 is coupled to the resistor R18 and a resistor R19. An input voltage of the resistor R18 is the initial reference voltage Vref, and the resistor R19 is coupled to the other terminal of the resistor R18. An input voltage of an inverting input terminal of the amplifier OP1 is the rectified voltage Vret. The amplifier OP1 compares the rectified voltage Vret with a reference voltage Vr2 (generated after the reference voltage Vref is divided by resistor R18). If the rectified voltage Vret is less than the reference voltage Vr2, the amplifier OP1 outputs an enable signal, otherwise the amplifier OP1 outputs a disenable signal.

The comparator C2-1 includes an amplifier OP2-1 and the resistor R19. A non-inverting input terminal of the amplifier OP2-1 is coupled to the resistor R19 and a resistor R20. An input voltage of the resistor R19 is the reference voltage Vr2 passing through the resistor R18. An inverting input terminal of the amplifier OP2-1 receives the rectified voltage Vret. The amplifier OP2-1 compares the rectified voltage Vret with a reference voltage Vr3 (generated after the reference voltage Vr3 is divided by the resistors R18 and R19). If the rectified voltage Vret is less than the reference voltage Vr3, the amplifier OP2-1 outputs an enable signal, otherwise the amplifier OP2-1 outputs a disenable signal.

The comparator C2-2 includes an amplifier OP2-2 and the resistor R20. Operation of thereof is the same as the above, and description thereof is thus not provided therein. The comparator C2-3 includes an amplifier OP2-3 and a resistor R21. Operation of thereof is the same as the above, and description thereof is thus not provided therein.

The switches S1-1, S2-1, S2-2, and S2-3 are respectively coupled to output terminals of the comparators C1-2, C2-1, C2-2, and C2-3. The switches S1-1, S2-1, S2-2, and S2-3 are coupled to the first power terminal P1 and the second power terminal P2. Further, the switches S1-1, S2-1, S2-2, and S2-3 are respectively coupled to resistors R28 and R29, resistors R26 and R27, resistors R24 and R25, and resistors R22 and R23 of the impedance adjustment circuit 152. The switches S1-1, S2-1, S2-2, and S2-3 are turned on according to the enable signal and are cut off according to the disenable signal.

The impedance adjustment circuit 152 decreases impedance of the control terminal G1 and impedance of the control terminal G2 according to turning-on states of the switches S1-1, S2-1, S2-2, and S2-3.

In this embodiment, the impedance adjustment circuit 152 includes the resistor R22 coupled between the control terminal G1 and the switch S2-3, the resistor R23 coupled between the control terminal G2 and the switch S2-3, the resistor R24 coupled between the control terminal G1 and the switch S2-2, the resistor R25 coupled between the control terminal G2 and the switch S2-2, the resistor R26 coupled between the control terminal G1 and the switch S2-1, the resistor R27 coupled between the control terminal G2 and the switch S2-1, the resistor R28 coupled between the control terminal G1 and the switch S1-1, and the resistor R29 coupled between the control terminal G2 and the switch S1-1. In an embodiment, resistance values in a descending order is the resistors R28 and R29, the resistors R26 and R27, the resistors R24 and R25, and the resistors R22 and R23. Nevertheless, in other embodiments, the resistance values may change according to actual needs.

Note that the comparators C1-2, C2-1, C2-2, and C2-3 may compare the rectified voltage Vret with different reference voltages. For instance, the reference voltage Vr2 compared by the comparator C1-2 is 10 volts. The reference voltage Vr3 compared by the comparator C2-1 is 9 volts. A reference voltage Vr4 compared by the comparator C2-2 is 8 volts. A reference voltage Vr5 compared by the comparator C2-3 is 7 volts.

If the rectified voltage Vret is lower than the reference voltage Vr5 compared by the comparator C2-3, the switches S1-1, S2-1, S2-2, and S2-3 are cut off, and the bias voltage of the control terminal G1/G2 is affected by the impedance of the resistor R1/R3. If the rectified voltage Vret is between the reference voltage Vr5 and the reference voltage Vr4 compared by the comparator C2-3 and the comparator C2-2, the switch S2-3 is turned on. The bias voltages of the control terminals G1 and G2 are respectively affected by impedance (i.e., reduced voltage) of the resistor R1 and the resistor R22 connected in parallel the resistor R3 and the resistor R23 connected in parallel, and in this way, the voltage (or the rectified voltage Vret) of the output terminal O1 of the bias voltage 110 is increased. If the rectified voltage Vret is between the reference voltage Vr4 and the reference voltage Vr3 compared by the comparator C2-2 and the comparator C2-1, the switches S2-3 and S2-2 are turned on. The bias voltages of the control terminals G1 and G2 are further lowered as respectively affected by impedance generated after the resistor R1, the resistor R22, and the resistor R24 are connected in parallel and the resistor R3, the resistor R23, and the resistor R25 are connected in parallel. If the rectified voltage Vret is between the reference voltage Vr3 and the reference voltage Vr2 compared by the comparator C2-1 and the comparator C1-2, the switches S2-3, S2-2, and S2-1 are turned on. The bias voltages of the control terminals G1 and G2 are further lowered as respectively affected by impedance generated after the resistor R1, the resistor R22, the resistor R24, and the resistor R26 are connected in parallel and the resistor R3, the resistor R23, the resistor R25, and the resistor R27 are connected in parallel. If the rectified voltage Vret is greater than the reference voltage Vr2 compared by the comparator C1-2, the switches S2-3, S2-2, S2-1, and 1-1 are turned on. The bias voltages of the control terminals G1 and G2 are further lowered as respectively affected by impedance generated after the resistor R1, the resistor R22, the resistor R24, the resistor R26, and the resistor R28 are connected in parallel and the resistor R3, the resistor R23, the resistor R25, the resistor R27, and the resistor R29 are connected in parallel. Operation of the Zener diode ZD3 is identical to that of the Zener diode ZD, and description thereof is thus not provided therein.

Based on the disclosure spirit provided in FIG. 6, numbers, components, and parameters of the switches, the comparators, and the impedance adjustment circuit may be further changed. For instance, FIG. 6 provides a five-stage reference voltage comparison, while three-stage, four-stage, six-stage, or more may be provided in other embodiments. Besides, the impedance adjustment circuits 151 and 152 may include more resistors combined through different connection manners or may include variable resistors.

In the embodiments of FIG. 4 to FIG. 6, the voltage of the first power terminal P1 is greater than the voltage of the second power terminal P1 (that is, the first transistor M1 and the second transistor M2 are turned on). For instance, the bias adjustment circuit 150 is connected to the control terminals G1 and G2 only. In some embodiments, the bias adjustment circuit 150 further includes a third output terminal coupled to the control terminal G3 of the third transistor M3 and a fourth output terminal coupled to the control terminal G4 of the fourth transistor M4. Based on the foregoing disclosure spirit, the bias adjustment circuit 150 may change bias voltages of the control terminals G3 and G4 according to the rectified voltage outputted by the bridge circuit 110. For instance, in FIG. 4, the resistors R5 and R6 may be coupled to the control terminals G3 and G4. In FIG. 5, the resistor R9 of the impedance adjustment circuit 151 may be coupled to the control terminals G3 and G4. In FIG. 5, the resistors R22, R24, R26, and R28 and the resistors R23, R25, R27, and R29 of the impedance adjustment circuit 152 may be respectively coupled to the control terminals G3 and G4. In this way, diversified power input methods may be provided. For instance, an AC power source, a DC power source with reverse polarity, and the like.

In view of the foregoing, in the green bridge circuit provided by the embodiments of the disclosure, transistors are used in the bridge circuit, and the bias adjustment circuit adjusts the bias voltages of the control terminals of the transistors according to the magnitude of the rectified voltage outputted by the bridge circuit to change the rectified voltage. Accordingly, in the embodiments of the disclosure, loss in the bridge circuit caused by the electrical energy is lowered, and heat generation is thereby reduced. In addition, the problem of decrease in the rectified voltage caused by the transmission line loss is solved in the embodiments of the disclosure, and power input of various different voltages may also be applied.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A green bridge circuit, comprising:
   a bridge circuit, connected to a system load through a filter, comprising:
      a first transistor, having a first terminal connected to a first power terminal and a second terminal connected to the filter;
      a second transistor, having a first terminal connected to a second power terminal and a second terminal connected to the filter;
      a third transistor, having a first terminal connected to the second power terminal and a second terminal connected to the filter, wherein the first terminal of the third transistor is further coupled to the first terminal of the second transistor, and the second terminal of the third transistor is further coupled to the second terminal of the first transistor; and
      a fourth transistor, having a first terminal connected to the first power terminal and a second terminal connected to the filter, wherein the first terminal of the fourth transistor is further coupled to the first terminal of the first transistor, and the second terminal of the fourth transistor is further coupled to the second terminal of the second transistor; and
   a bias adjustment circuit, having a first input terminal coupled to an output terminal of the bridge circuit, a first output terminal coupled to a control terminal of the first transistor, and a second output terminal coupled to a control terminal of the second transistor, configured to change a bias voltage of the control terminal of the first transistor and a bias voltage of the control terminal of the second transistor according to a rectified voltage outputted by the bridge circuit, wherein the bias adjustment circuit is further configured to increase the bias voltage of the control terminal of the first transistor and the bias voltage of the control terminal of the second transistor in response to the rectified voltage being less than a reference voltage, the bias adjustment circuit comprises:
- a first comparator, coupled to the output terminal of the bridge circuit, configured to compare the rectified voltage with the reference voltage;
- a first switch, coupled to the first comparator; and
- an impedance adjustment circuit, coupled to the first switch, wherein the impedance adjustment circuit is further coupled to the control terminal of the first transistor, is coupled to the control terminal of the second transistor, and is configured to decrease impedance between the control terminal of the first transistor and the second power terminal and impedance between the control terminal of the second transistor and the first power terminal according to a turning-on state of the first switch.

2. The green bridge circuit according to claim 1, wherein the impedance adjustment circuit comprises:
- a first resistor, coupled between the first switch and the control terminal of the first transistor, wherein the first switch is further coupled to the second power terminal; and
- a second resistor, coupled between the first switch and the control terminal of the second transistor, wherein the first switch is further coupled to the first power terminal.

3. The green bridge circuit according to claim wherein the impedance adjustment circuit further comprises:
- at least one second comparator, coupled to the output terminal of the bridge circuit, configured to compares the rectified voltage with at least one second reference voltage, and the reference voltage and the at least one second reference voltage are different; and
- at least one second switch, coupled to the at least one second comparator, wherein the impedance adjustment circuit is configured to further decrease the impedance between the control terminal of the first transistor and the second power terminal and the impedance between the control terminal of the second transistor and the first power terminal according to a turning-on state of the at least one second switch.

4. The green bridge circuit according to claim 3, wherein the impedance adjustment circuit comprises:
- at least one third resistor, coupled to between the at least one second switch and the control terminal of the first transistor, wherein the at least one second switch is further coupled to the second power terminal; and
- at least one fourth resistor, coupled to between the at least one second switch and the control terminal of the second transistor, wherein the at least one second switch is further coupled to the first power terminal.

5. The green bridge circuit according to claim 1, wherein the bias adjustment circuit further comprises a third output terminal coupled to a control terminal of the third transistor and a fourth output terminal coupled to a control terminal of the fourth transistor, the bias adjustment circuit is configured to change a bias voltage of the control terminal of the third transistor and a bias voltage of the control terminal of the fourth transistor according to the rectified voltage outputted by the bridge circuit.

6. The green bridge circuit according to claim 1, wherein the bias adjustment circuit further comprises:
- a Zener diode, coupled between the output terminal and an input terminal of the bridge circuit, wherein the Zener diode breaks down in response to the rectified voltage being less than a third reference voltage, and the Zener diode is cut off in response to the rectified voltage not being less than the third reference voltage.

* * * * *